United States Patent
Kang et al.

(10) Patent No.: US 9,224,927 B2
(45) Date of Patent: Dec. 29, 2015

(54) WHITE LIGHT EMITTING DIODE AND BACKLIGHT MODULE

(71) Applicant: SHENZHEN CHINA STAR OPTOELECTRONICS TECHNOLOGY CO., LTD., Shenzhen (CN)

(72) Inventors: Chihtsung Kang, Shenzhen (CN); Zanjia Su, Shenzhen (CN)

(73) Assignee: SHENZHEN CHINA STAR OPTOELECTRONICS TECHNOLOGY CO. LTD., Shenzhen (CN)

(*) Notice: Subject to any disclaimer, the term of this patent is extended or adjusted under 35 U.S.C. 154(b) by 87 days.

(21) Appl. No.: 14/235,803

(22) PCT Filed: Dec. 31, 2013

(86) PCT No.: PCT/CN2013/091007
§ 371 (c)(1),
(2) Date: Jan. 29, 2014

(87) PCT Pub. No.: WO2015/089882
PCT Pub. Date: Jun. 25, 2015

(65) Prior Publication Data
US 2015/0194575 A1    Jul. 9, 2015

(30) Foreign Application Priority Data
Dec. 17, 2013  (CN) .......................... 2013 1 0695057

(51) Int. Cl.
H01L 33/00    (2010.01)
H01L 33/50    (2010.01)
G02F 1/1368   (2006.01)
F21V 8/00     (2006.01)

(52) U.S. Cl.
CPC ............ H01L 33/502 (2013.01); G02F 1/1368 (2013.01); *G02B 6/0023* (2013.01); *G02B 6/0073* (2013.01)

(58) Field of Classification Search
CPC ....... H01L 33/502; H01L 33/56; H01L 33/50; G02F 1/1368; G02B 6/0035; G02B 6/0073
See application file for complete search history.

(56) References Cited

U.S. PATENT DOCUMENTS

| 2004/0033388 A1* | 2/2004 | Kim et al. ...................... 428/690 |
| 2009/0237593 A1* | 9/2009 | Hoshi .............................. 349/62 |
| 2010/0002440 A1* | 1/2010 | Negley et al. ............. 362/249.14 |
| 2013/0002157 A1* | 1/2013 | van de Ven et al. ........... 315/192 |

* cited by examiner

*Primary Examiner* — Donald Raleigh
(74) *Attorney, Agent, or Firm* — Mark M Friedman

(57) ABSTRACT

A white light emitting diode and a backlight module are provided. The light emitting diode comprises a blue chip and an encapsulating layer having yttrium aluminum garnet phosphor powder mixed therein, wherein the dominant wavelength in a frequency spectrum of blue light emitted from the blue chip is between 448 and 462.5 nm, the peak wavelength of yellow light emitted from the yttrium aluminum garnet phosphor powder is between 550 and 575 nm, and the doped concentration of the yttrium aluminum garnet phosphor powder is 0.01% to 0.1% by weight of the encapsulating layer. Due to the red shift of the peak wavelength of the blue light emitted from the blue chip, the brightness of the white LED is enhanced (>10%).

7 Claims, 2 Drawing Sheets

WHITE LIGHT EMITTING DIODE AND BACKLIGHT MODULE

FIELD OF THE INVENTION

The present invention relates to a white light emitting diode, and in particular relates to a white light emitting diode for a backlight module.

BACKGROUND OF THE INVENTION

In the variety of display technologies, liquid crystal display (LCD) is widely accepted as a mature technology. In an LCD, the electro-optical effect of the liquid crystal is utilized to control the transmission and reflectivity of the liquid crystal unit by adjusting the electric circuit. Therefore, the intensity of the light emitted from the backlight module and passing through the color layer can be adjusted to achieve a different gray scale and the different colors of the image display. The backlight module is the most important component in an LCD for providing light.

In order to maintain a high quality display (the same brightness, uniformity, viewing angle, etc.), it is very necessary to use new backlight technologies to achieve a lower cost backlight module while enhancing the competitiveness of the product.

For improving the material efficiency of each portion, the light emitting diode (LED) as a backlight occupies an important part. If the LED can be driven in the same current and voltage while only changing or improving the internal structure or the arrangement of LED chip and the phosphor powder to enhance the luminous efficiency, then the above-described goal of reducing costs can be achieved. In addition, it is also possible to achieve cost reduction for the entire module by optimizing the coordination of the LED spectrum and the TFT (Thin-Film Transistor) penetrating spectrum to reach the same white point chromaticity, and then cooperating with the above-mentioned ways to improve the efficiency of LED.

White LED is currently used in LCD backlight modules, which is formed by mixing the blue light emitted from blue chips and the yellow light emitted from stimulated YAG (yttrium aluminum garnet)/Silicate/Nitrides ($NO_x$) phosphor powder and a white light is presented in the human eyes.

For the LED applied to an LCD backlight module, because it is necessary to meet the NTSC color gamut established by National Television Standards Committee, the blue light of an LED usually requires a shorter wavelength. The current blue chip of an LED applied to an LCD backlight module usually has a peak wavelength (Wp) emitted by blue chips in the range of 440-445 nanometers (nm) and the dominant wavelength (Wd) of the corresponding spectrum in the range of 444-452.5 nanometers (nm), the conversion of Wd and the Wp is related to FWHM (Full Width of Half Maximum) of the blue chip chromatography.

However, the LED has greater efficiency while the Wp is at the long wavelength. From the viewpoint of the brightness, when the ratio of energy passed into the human eyes in the visual function is increasing, the brightness of the LED will be promoted. In addition, the exciting efficiency of YAG phosphor powder is different from the excitation wavelengths of different sources, in general, the best excitation wavelength is about 450 nanometers (the YAG from different suppliers or made of different components may has a slightly different excitation spectrum). When the Wp shifts from 440 nm to 450 nm continuously, the efficient excitation energy of the YAG can be calculated by the excitation spectrum of the YAG phosphor powder and will be increasing. Finally, after Wp red-shifting, the light emitted from the LED is absorbed by the backlight unit (LGP, diaphragm), the spectrum of the emitted blue light has the increased brightness ratio. Equally, the brightness ratio is continuously increasing after the light passes the TFT so that the NTSC color gamut of the LCD module presents an increased ratio of blue light and the whole module outputs a bluish light. Therefore, it is necessary to adjust the NTSC color gamut back to the original color gamut.

Therefore, it is necessary to provide a white light emitting diode to solve the problems existing in conventional technologies, as described above.

SUMMARY OF THE INVENTION

A primary object of the present invention is to provide a white light emitting diode which comprises a blue chip having red shift of the peak wavelength of the blue light to enhance the brightness (>10%). Furthermore, the process of increasing the concentration of YAG phosphor powder will also enhance the LED brightness because the ratio of YAG powder is increased to adjust the NTSC color gamut back to the original color gamut.

A secondary object of the present invention is to provide a backlight module manufactured with the white light emitting diode as mentioned above, wherein the white light emitting diode can be combined with a plurality of optical members (such as a reflection sheet, a light guide/diffusion plate or films, etc.) to achieve the benefits of reducing manufacturing costs and improving the optical efficiency.

To achieve the above objects, the present invention provides a white light emitting diode which comprises a blue chip and an encapsulating layer having yttrium aluminum garnet phosphor powder mixed therein, wherein the peak wavelength of blue light emitted from the blue chip is between 445 and 460 nm, and the peak wavelength of yellow light emitted from the yttrium aluminum garnet phosphor powder is between 550 and 575 nm.

In one embodiment of the present invention, the doped concentration of the yttrium aluminum garnet phosphor powder is 0.01 to 0.1% by weight of the encapsulating layer.

In one embodiment of the present invention, the dominant wavelength in a frequency spectrum of the blue light emitted from the blue chip is between 448 and 462.5 nm.

In one embodiment of the present invention, the peak wavelength of the blue light emitted from the blue chip is between 445 and 455 nm.

Furthermore, the present invention provides a backlight module which comprises a white light emitting diode as mentioned above.

In one embodiment of the present invention, the backlight module further comprises: a reflection sheet, a light guide plate and a diffusion film.

In one embodiment of the present invention, the doped concentration of the yttrium aluminum garnet phosphor powder is 0.01 to 0.1% by weight of the encapsulating layer.

In one embodiment of the present invention, the backlight module further comprises a liquid crystal module disposed thereon, the doped concentration of the yttrium aluminum garnet phosphor powder is obtained based on the penetrating spectrum of a thin-film transistor substrate in the liquid crystal module so that the white point of the LCD module reaches a target value.

In one embodiment of the present invention, the dominant wavelength in a frequency spectrum of the blue light emitted from the blue chip is between 448 and 462.5 nm, the peak wavelength of the blue light emitted from the blue chip is between 445 and 455 nm.

Compared with current techniques, the white light emitting diode according to the present invention can reduce the manufacturing costs simply by adjusting the peak wavelength and concentration of the phosphor powder to achieve the NTSC color gamut and white point of the LCD module.

The structure and the technical means adopted by the present invention to achieve the above and other objects can be best understood by referring to the following detailed description of the preferred embodiments and the accompanying drawings.

DETAILED DESCRIPTION OF THE PREFERRED EMBODIMENTS

The structure and the technical means adopted by the present invention to achieve the above and other objects can be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, etc., are only directions by referring to the accompanying drawings, and thus the used directional terms are used to describe and understand the present invention, but the present invention is not limited thereto.

Figure 1:
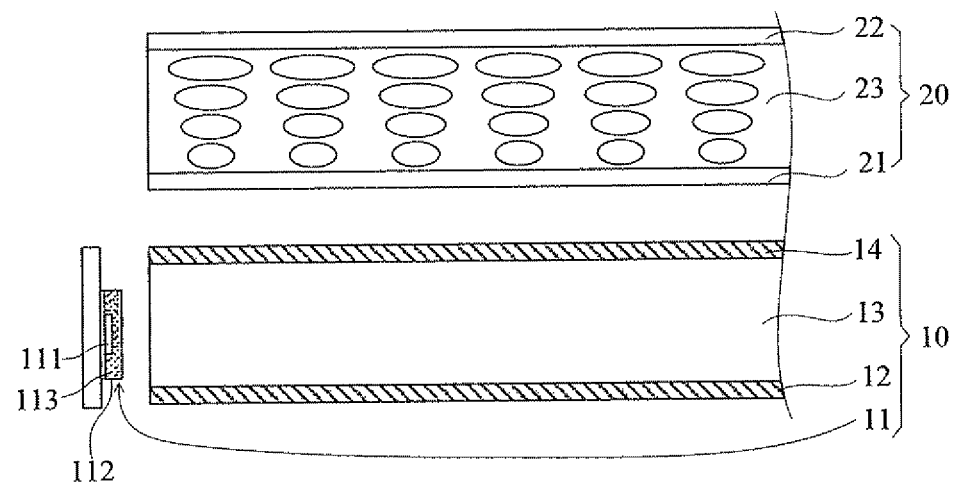
FIG. 1 is a schematic cross-sectional view of the liquid crystal module and the backlight module according to a preferred embodiment of the present invention.

Please refer to FIG. 1, a backlight module 10 according to a preferred embodiment of the present invention is illustrated, and comprises: at least one white light emitting diode (LED) 11, a reflection sheet 12, a light guide plate 13 and a diffusion film 14, wherein the white light emitting diode 11 mainly includes a blue chip (blue light chip) 111 and an encapsulating layer 112 (such as epoxy or silicone) having yttrium aluminum garnet (YAG) phosphors powder 113 mixed therein. A light bar composed of the white light emitting diodes 11 and a printed circuit board is disposed on at least one side of the light guide plate 13, or disposed between the light guide plate 13 and the reflection sheet 12 to serve as a direct lighting or a bottom lighting backlight module. Furthermore, the backlight module 10 further comprises a liquid crystal module 20 disposed on the top thereof, the liquid crystal module 20 includes a thin-film transistors (TFT) substrate 21, a color filter (CF) substrate 22, and a liquid crystal layer 23, wherein the liquid crystal layer 23 is disposed between the TFT substrate 21 and the CF substrate 22, the TFT substrate 21 is typically located below the liquid crystal layer 23 and the CF substrate 22.

In the present invention, a preferred embodiment provides a white light emitting diode 11, wherein the peak wavelength of the blue light emitted from the blue chip 111 is set between 445 and 460 nm (nanometers), and preferably set between 445 and 460 nm, for example 448, 455, or 459 nm, but is not limited thereto. The peak wavelength of the yellow light emitted from the encapsulating layer 112 which is mixed with yttrium aluminum garnet (YAG) phosphor powder 113 is set between 550 and 575 nm, for example 555, 562, or 570 nm, but is not limited thereto. The doped concentration of the YAG phosphor powder 113 in the encapsulating layer 112 is 0.01 to 0.1% by weight of the encapsulating layer 112. In addition, the dominant wavelength ($W_d$) in a frequency spectrum of the blue light emitted from the blue chip 111 is preferably set between 448 to 462.5 nm, for example 450 or 460 nm.

Furthermore, another embodiment of the present invention provides a backlight module 10 which includes the white light emitting diode 11 as mentioned above. In practical applications, in order to improve the uniformity of brightness in the backlight module 10, a reflection sheet 12, a light guide plate 13, and a diffusion film 14 are included optionally. Preferably, doped the concentration of the yttrium aluminum garnet phosphors powder 113 is 0.01 to 0.1% by weight of the encapsulating layer 112, wherein the doped concentration can be adjusted with reference to the penetration spectrum of the TFT substrate 21 in the liquid crystal module 20 so that the NTSC color gamut and white point of the backlight module 10 reach a target value. The white light emitting diode and the backlight module according to the present invention can be implemented exemplarily as in the following two technical solutions:

Solution I:

To control the peak wavelength Wp of the blue light emitted by the blue chip between 445 and 455 nm, i.e. the dominant wavelength Wd of the corresponding spectrum is between 448 and 462.5 nm, then adjusting peak wavelength of the yellow light emitted from the yttrium aluminum garnet phosphor powder between 550 and 575 nm, and adjusting the doped concentration of the phosphor powder (0.01 to 0.1% by weight of the encapsulating layer) with reference to the penetrating spectrum of the TFT substrate, substantially, each spectral value of the LED spectrum corresponding to 1 nm is multiplied by each spectral value of the penetrating spectrum of the TFT substrate corresponding to 1 nm to obtain the corresponding spectrum of the LCD module. That is, the corresponding spectrum of the LCD module can be calculated by adjusting the doped concentration of phosphor powder to modify the spectrum to a different LED spectrum so that the required NTSC color gamut and the white point of the LCD module is finally achieved. When this white LED is applied to a LCD backlight module, the backlight module can be direct type or edge type and includes the optical members (such as a reflection sheet, a light guide/diffusion plate or films, etc). The LED frequency spectrum of solution I is shown in FIG. 2.

Solution II:

To control the peak wavelength Wp of the blue light emitted by the blue chip between 450 and 460 nm, i.e. the dominant wavelength Wd of the corresponding spectrum is between 453 and 467.5 nm, then adjusting the peak wavelength of the yellow light emitted from the yttrium aluminum garnet phosphor powder between 550 and 575 nm, and adjusting the doped concentration of the phosphor powder (0.01 to 0.1% by weight of the encapsulating layer) is obtained with reference to the penetrating spectrum of the TFT substrate, substantially, each spectral value of the LED spectrum corresponding to 1 nm is multiplied by each spectral value of the penetrating spectrum of the TFT substrate corresponding to 1 nm to obtain the corresponding spectrum of the LCD module. That is, the corresponding spectrum of the LCD module can be calculated by adjusting the doped concentration of phosphor powder to modify the spectrum to a different LED spectrum so that the required NTSC color gamut and the white point of the LCD module is finally achieved. When this white LED is applied to a LCD backlight module, the backlight module can be direct type or edge type and includes the optical members (such as a reflection sheet, a light guide/diffusion plate or films, etc.). The LED frequency spectrum of solution II is shown in FIG. 3.

Figure 2:
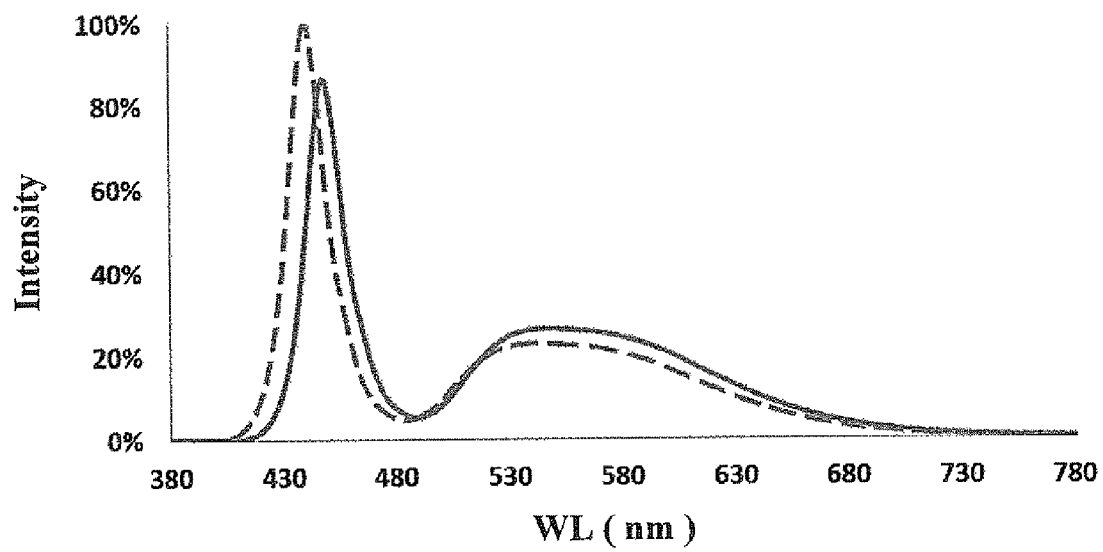
FIG. 2 is the frequency spectrum of a white light emitting diode in Solution 1 according to the preferred embodiment of the present invention before and after the adjustment.
Figure 3:
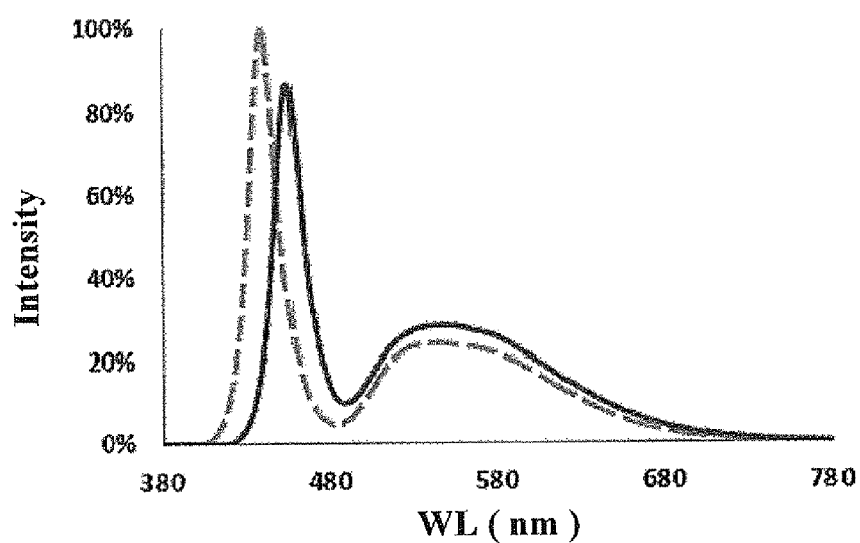
FIG. 3 is the frequency spectrum of a white light emitting diode in Solution II according to the preferred embodiment of the present invention before and after the adjustment.

Please refer to FIGS. 2-3, the dotted line represents the diagram of the curve of the LED frequency spectrum before adjustment; and the solid line represents the diagram of curve of the LED spectrum after adjustment. From the spectral curve of solution I and solution II, it can be found that the red shift of the peak wavelength of the blue light emitted from the blue chip can make the required LED chromaticity increase, i.e. by increasing the doped concentration of phosphor powder to achieve that the LED brightness can be upgraded. Further, the brightness of the white LED according to the present invention can increase at least 10% when the Wp has 8 nm of red shift from 440 nm to 448 nm, as shown in Table 1.

TABLE 1

| Wp of blue light | Chromaticity of LED (x, y) | LED (Luminous flux) |
|---|---|---|
| 440 | (0.27, 0.24) | 100% |
| 448 | (0.29, 0.28) | 110% |

As described above, the brightness of the white light LED can be improved (>10%) by red shift of the Wp of the blue light emitted from the blue chip and then coordinating with the optimization of the backlight module, so as to enhance the visual/optical effects and reduce the cost of production of the backlight module.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A white light emitting diode, comprising:
    a blue chip; and an encapsulating layer having yttrium aluminum garnet phosphor powder mixed therein, wherein the dominant wavelength in a frequency spectrum of blue light emitted from the blue chip is between 448 and 462.5 nm, the peak wavelength of yellow light emitted from the yttrium aluminum garnet phosphor powder is between 550 and 575 nm, and the doped concentration of the yttrium aluminum garnet phosphor powder is 0.01% to 0.1% by weight of the encapsulating layer.

2. The white light emitting diode according to claim 1, wherein the peak wavelength of the blue light emitted from the blue chip is between 445 and 460 nm.

3. The white light emitting diode according to claim 1, wherein the peak wavelength of the blue light emitted from the blue chip is between 445 and 455 nm.

4. A backlight module, comprising a white light emitting diode as claimed in claim 1.

5. The backlight module according to claim 4, further comprising: a reflection sheet, a light guide plate and a diffusion film.

6. The backlight module according to claim 5, wherein the backlight module further comprises a liquid crystal module disposed thereon, the doped concentration of the yttrium aluminum garnet phosphor powder is obtained based on a penetrating spectrum of a thin-film transistor substrate in the liquid crystal module so that the white point of the LCD module reaches a target value.

7. The backlight module according to claim 4, wherein the backlight module further comprises a liquid crystal module disposed thereon, the doped concentration of the yttrium aluminum garnet phosphor powder is obtained based on a penetrating spectrum of a thin-film transistor substrate in the liquid crystal module so that the white point of the LCD module reaches a target value.

* * * * *